(12) United States Patent
Medina et al.

(10) Patent No.: US 10,797,010 B2
(45) Date of Patent: Oct. 6, 2020

(54) SEMICONDUCTOR PACKAGE HAVING A METAL BARRIER

(71) Applicant: TEXAS INSTRUMENTS INCORPORATED, Dallas, TX (US)

(72) Inventors: Joel Tomas Medina, Baguio (PH); Armando Tresvalles Clarina, Jr., La Trinidad (PH); Jay-Ar Tumaru Flores, Tabuk (PH); Ruby Ann Dizon Mamangun, Mabalacat (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 34 days.

(21) Appl. No.: 15/859,231

(22) Filed: Dec. 29, 2017

(65) Prior Publication Data
US 2019/0206817 A1 Jul. 4, 2019

(51) Int. Cl.
H01L 23/00 (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/03011* (2013.01); *H01L 2224/0401* (2013.01); *H01L 2224/05083* (2013.01); *H01L 2224/05124* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05582* (2013.01); *H01L 2224/05647* (2013.01); *H01L 2224/05666* (2013.01); *H01L 2224/11849* (2013.01); *H01L 2224/13111* (2013.01); *H01L 2224/13139* (2013.01); *H01L 2924/1304* (2013.01); *H01L 2924/14* (2013.01); *H01L 2924/16152* (2013.01)

(58) Field of Classification Search
CPC .......... H01L 24/05; H01L 24/13; H01L 24/03
See application file for complete search history.

(56) References Cited

U.S. PATENT DOCUMENTS

| | | | |
|---|---|---|---|
| 5,374,503 A * | 12/1994 | Sachdev | G03F 7/0035 216/47 |
| 5,503,286 A * | 4/1996 | Nye, III | H01L 24/03 216/100 |
| 6,569,752 B1 * | 5/2003 | Homma | H01L 24/03 257/678 |
| 6,740,580 B1 | 5/2004 | Gupta et al. | |
| 7,838,991 B1 | 11/2010 | Mostafazadeh et al. | |
| 9,082,762 B2 | 7/2015 | Kang et al. | |
| 2004/0262778 A1 | 12/2004 | Hua | |
| 2006/0055037 A1 * | 3/2006 | Park | H01L 24/11 257/737 |
| 2012/0049356 A1 * | 3/2012 | Migita | H01L 21/76885 257/737 |
| 2014/0264843 A1 * | 9/2014 | Lin | H01L 24/81 257/737 |
| 2014/0270784 A1 * | 9/2014 | Thacker | G02B 6/4284 398/115 |

\* cited by examiner

*Primary Examiner* — Bilkis Jahan
*Assistant Examiner* — Victor V Barzykin
(74) *Attorney, Agent, or Firm* — Dawn Jos; Charles A. Brill; Frank D. Cimino

(57) ABSTRACT

A semiconductor device having a barrier metal layer positioned over a metallization layer, and an under bump metallurgy layer over the barrier metal layer, and a solder bump over the under bump metallurgy layer.

19 Claims, 7 Drawing Sheets

SEMICONDUCTOR PACKAGE HAVING A METAL BARRIER

BACKGROUND OF RELATED ART

Aspects of the disclosure relate generally to the packaging of integrated circuits. Conventional processes for packaging integrated circuits include one that is commonly referred to as "flip chip" packaging generally, which can include forming solder bumps (or other suitable contacts) directly on the face of an integrated circuit die. The die can be attached to a substrate such as a printed circuit board or package substrate directly connecting the die to corresponding contacts on the substrate.

One of the drawbacks of the flip chip package is the issue of high RDS(on), which stands for "drain-source on resistance" or the resistance between the drain and source in a metal oxide field effect transistor (MOSFET). As a result, there is a need to reduce the RDS(on) for flip chip packages.

SUMMARY

One aspect of the present disclosure identifies the causes of RDS(on). Another aspect of the present disclosure provides a barrier metal layer over a metallization layer that protects the metallization layer from tetramethylammonium hydroxide (TMAH) attack, which reduces the amount of RDS(on). Another aspect of the disclosure provides an example of a semiconductor device having a barrier metal layer. Another aspect of the disclosure provides an example of steps of manufacturing a semiconductor device having a barrier metal layer.

BRIEF DESCRIPTION OF THE DRAWINGS

For a detailed description of various examples, reference will now be made to the accompanying drawings in which.

DETAILED DESCRIPTION

Figure 1:
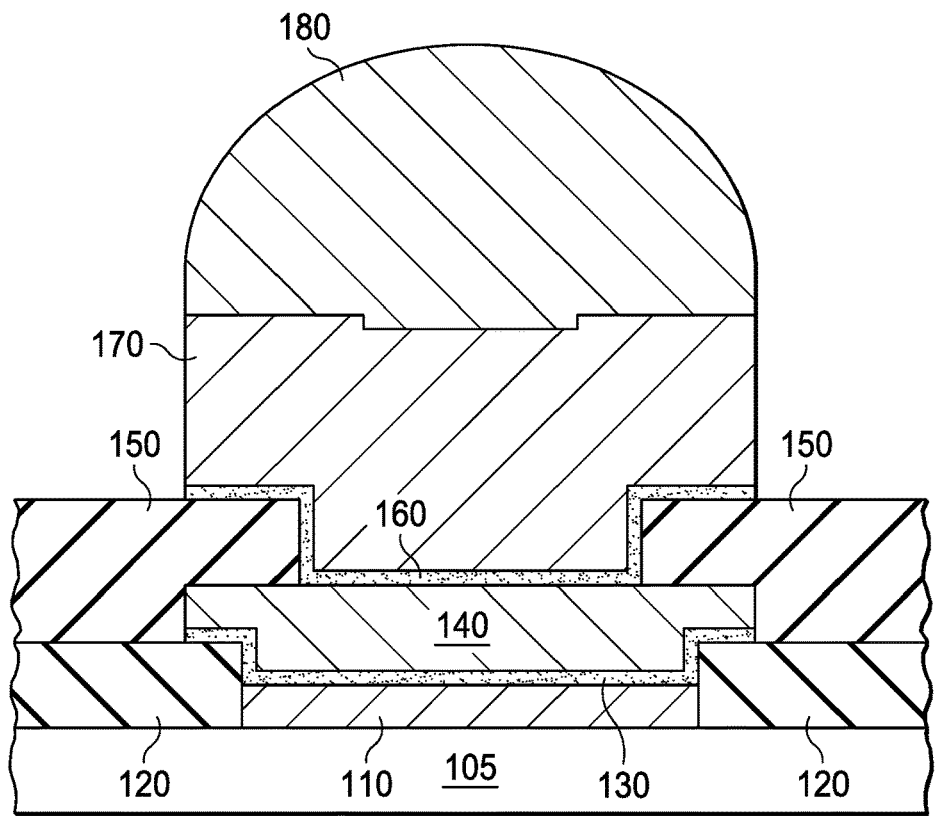
FIG. 1 illustrates a semiconductor device having a barrier metal layer.

Aspects of the disclosure relate generally to bumped semiconductor devices. In an example illustrated in FIG. 1, a cross-sectional view of a semiconductor device is a flip chip structure 100 having an integrated circuit 105 with functional circuitry. A metallization layer 110 is formed over the integrated circuit 105. A passivation layer 120 is formed adjacent to the metallization layer 110. A first adhesion layer 130 is formed over the metallization layer 110 and portions of the passivation layer 120. A barrier metal layer 140 is formed over the first adhesion layer 130.

A polyimide layer 150 is formed adjacent the barrier metal layer 140 with portions covering topmost surfaces of the barrier metal layer 140. A second adhesion layer 160 is formed over portions of the polyimide layer 150 and covering exposed portions of the barrier metal layer 140 between the polyimide layer 150. An under bump metallurgy layer 170 is formed over the second adhesion layer 160. A solder bump 180 is formed over the under bump metallurgy layer 170.

The configuration of the example shown in FIG. 1 integrated circuit 105 with functional circuitry serves at least two purposes. First, it reduces the amount of polyimide layer 150 material by compensating that removal with the barrier layer such that the performance of the semiconductor device 100 is reliable and commercially successful. Second, the barrier metal layer 140 protects the underlying metallization layer 130 from TMAH attack during processing, such as, for example, anisotropic etching and/or surface treatment.

It was found that removal of the polyimide material surrounding and the under bump metallurgy can improve RDS(on). Removal of the polyimide material, however, also decreases reliability performance, and therefore, in and of itself, is not a commercially viable solution to lowering RDS(on). The use of the barrier metal layer 140 mimics the effect of the polyimide material by compensating for the removal of the polyimide material.

It was also found that the metal barrier layer 140 protects the metallization layer, which can be formed of aluminum or an aluminum alloy (aluminum in combination with one or more of the following elements: copper, magnesium, manganese, silicon, tin and zinc). TMAH attacks the metallization layer resulting in increased resistance, and, as a result, increased RDS(on). The addition of the metal barrier layer 140 over the metallization layer 110 reduces the potential for TMAH attack, and thus reduces RDS(on).

Figure 2:
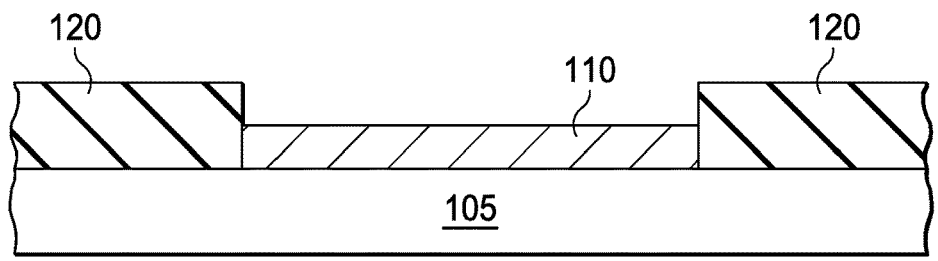
FIGS. 2-9 illustrate a method of making the semiconductor device having a barrier metal layer.

FIGS. 2-9 illustrate a method of manufacturing a semiconductor device having a barrier metal layer from a cross-sectional view. As illustrated in FIG. 2, an integrated circuit 105 is provided with a metallization layer 110 formed over the integrated circuit 105. The metallization layer 110 could be formed of aluminum or an aluminum alloy (aluminum in combination with one or more of the following elements: copper, magnesium, manganese, silicon, tin and zinc). In the illustrated example, the metallization layer 110 is formed on the integrated circuit 105. A passivation layer 120 is formed over portions of the integrated circuit 105. The passivation layer 120 can be an oxide or a nitride.

In the example illustrated, the passivation layer 120 is formed on portions of the integrated circuit 105 not having the metallization layer 110. This can be done by coating the integrated circuit 105 and the metallization layer 110, and selectively removing the portion of the passivation layer above the metallization layer 110. The removal process may be done by etching. The example illustrated provides a passivation layer 120 that has a cross-sectional height (as measured from first surface 121 facing the integrated circuit 105 and a second 122 surface opposite the first) that is greater than the cross-sectional height of the metallization layer 110.

It should be noted, however, that such an example is not intended to be limiting. For example, the cross-sectional height of the passivation layer 120 could be equal to or less than the cross-sectional height of the metallization layer 110. In such a case, it would be appreciated by a person of ordinary skill in the art that the passivation layer 120 could be formed prior to the metallization layer 110 and that chemical mechanical planarization or selective etching of the passivation layer 120 could be used to achieve a passivation layer having a cross-sectional height equal to or less than the cross-sectional height of the metallization layer 110.

Figure 3:
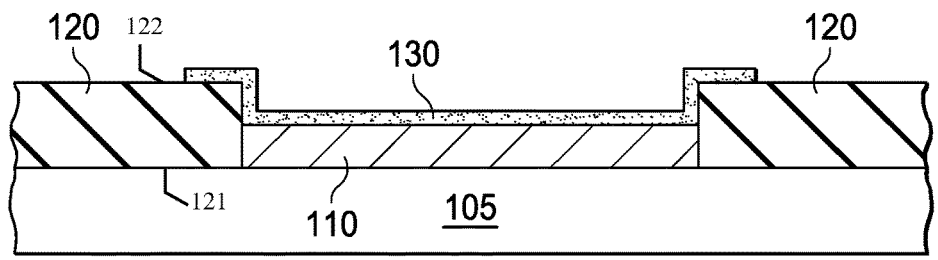

FIG. 3 illustrates the formation of a first adhesion layer 130. The adhesion layer 130 could be formed of titanium (TI) and its alloys (for example, TiW/Au, TiW/Ni/Au, TiW/Pd/Au and TiW/Cu/Ni/Au). The illustrated example has an adhesion layer 130 formed over the metallization layer 110 and sidewall portions 123 of the passivation layer 120. The adhesion layer 130 extends to shoulders 124 of the passivation layer 120 on which the barrier layer 140 (FIG. 4) will sit.

Figure 4:
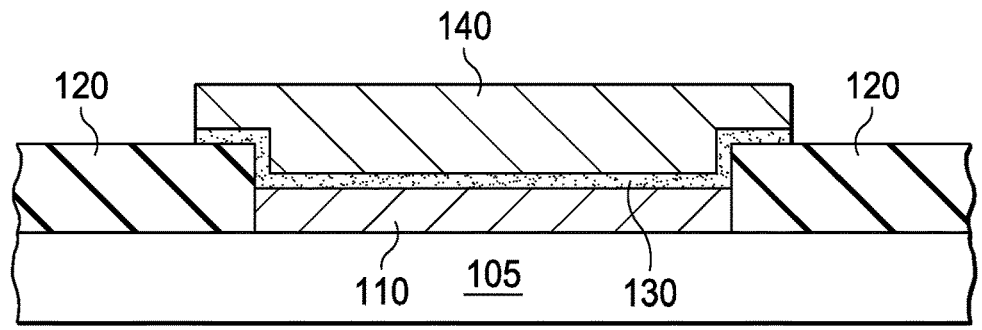

FIG. 4 illustrates the formation of a barrier layer 140. The barrier layer is formed of copper or nickel. Other materials include chromium, titanium (or its alloys) or palladium. The barrier layer 140 is formed over the first adhesion layer 130. In the example illustrated, the barrier layer 140 is formed directly on the first adhesion layer 130. The barrier layer 140 in this example is limited to being formed over the first adhesion layer 130. The barrier layer material can be formed over the entire FIG. 3 structure, but then removed from the portions over the passivation layer 120 not having the first adhesion layer 130.

Figure 5A:
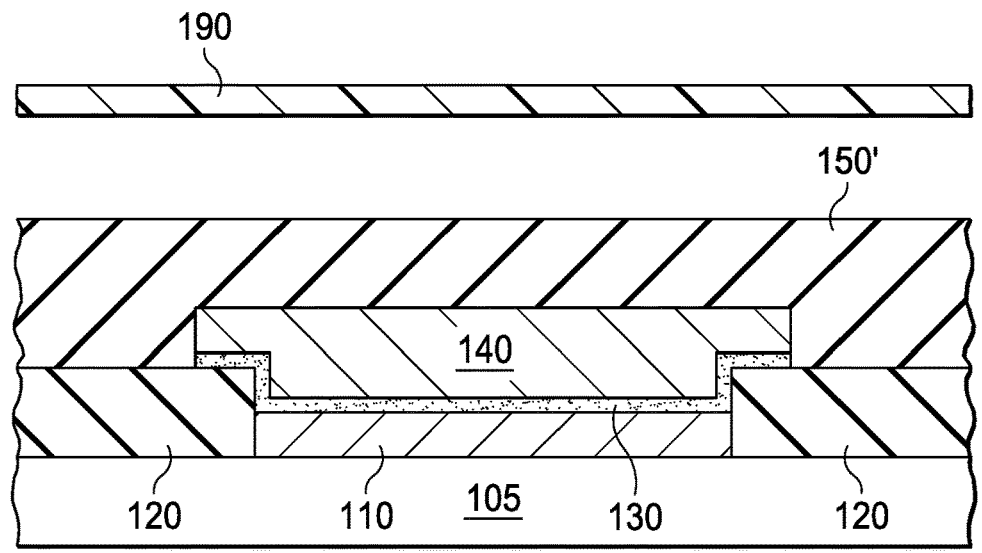
Figure 5B:
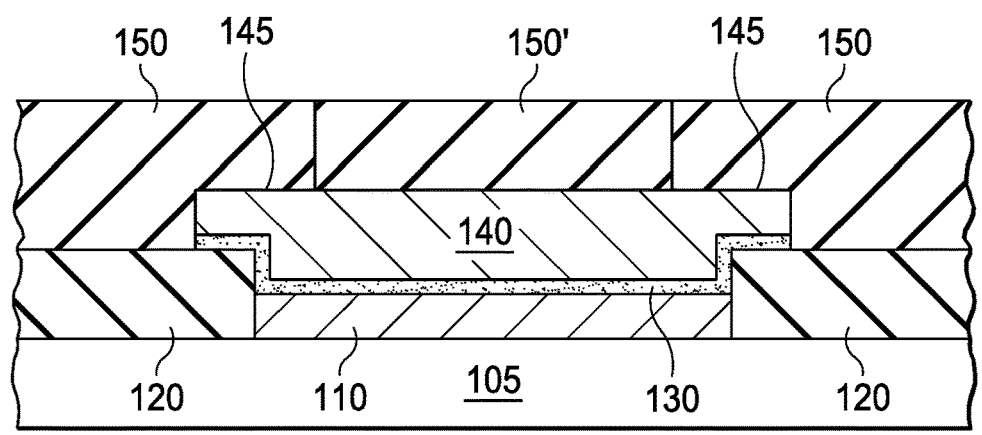
Figure 5C:
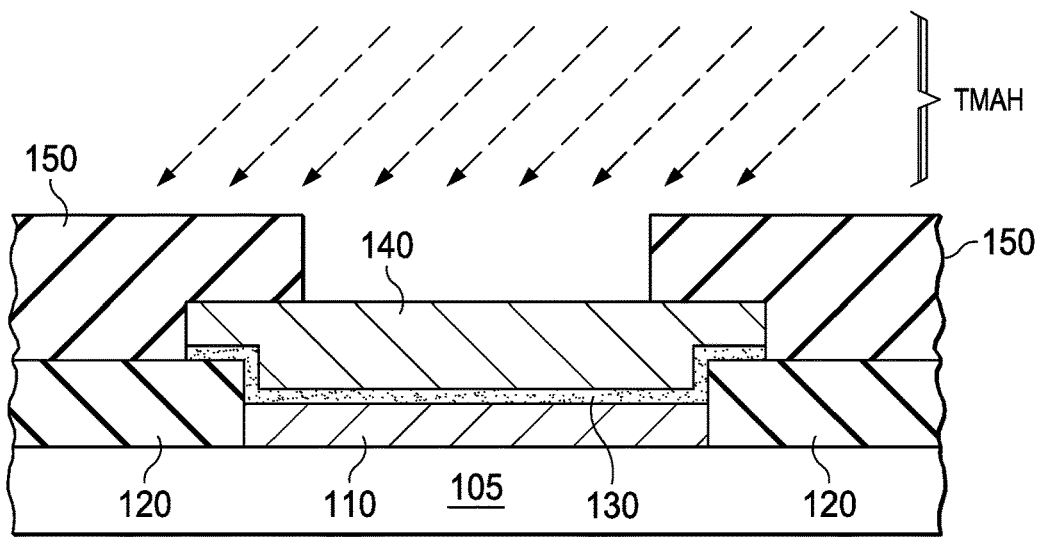
Figure 5D:
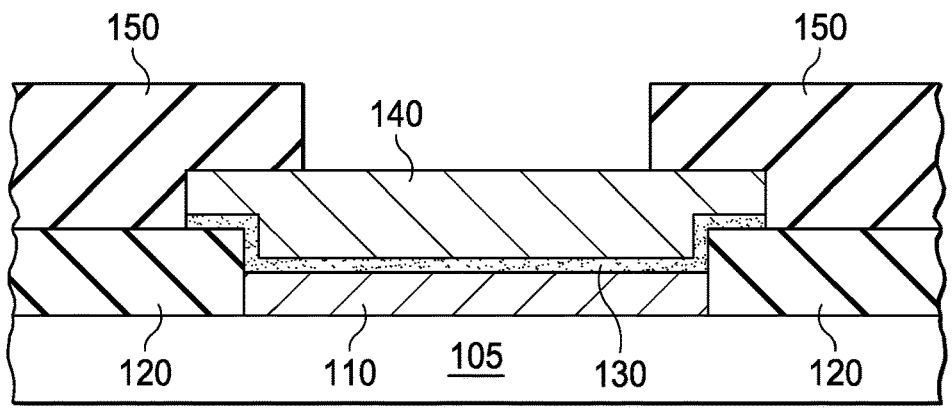

FIGS. 5A-5D illustrate the formation of a polyimide layer 150. As illustrated in FIG. 5A, a polyimide layer precursor 150' is formed over the entire FIG. 4 structure. A photoresist 190 is placed over the polyimide layer precursor 150' to selectively expose portions of the polyimide layer precursor 150' that are over the passivation layer 120 and lateral portions of barrier metal layer 145 (FIG. 5B) to cure portions of the polyimide layer precursor 150'. FIG. 5B shows the cured polyimide layer 150 over the passivation layer 120 and lateral portions of barrier metal layer 145. The uncured polyimide layer precursor 150' is subsequently removed by, for example, optical edge bead removal (OEBR), as shown in FIG. 5C. The resulting structure is then developed with the use of TMAH, as shown in FIG. 5C. The barrier metal layer 140 acts as a barrier to TMAH solution contacting the metallization layer 110. The example illustrated in FIG. 5 is particularly adapted to keep any TMAH solution from seeping into the regions near the metallization layer 110, since the barrier layer 140 extends over portions of the passivation layer 120 that are adjacent the metallization layer 110. As a result, there is little to no TMAH attack of the metallization layer 110. Since the integrity of the metallization layer 110 remains intact, the amount of resistance (as compared with a semiconductor device not having barrier metal layer 140) is significantly reduced.

Figure 6:
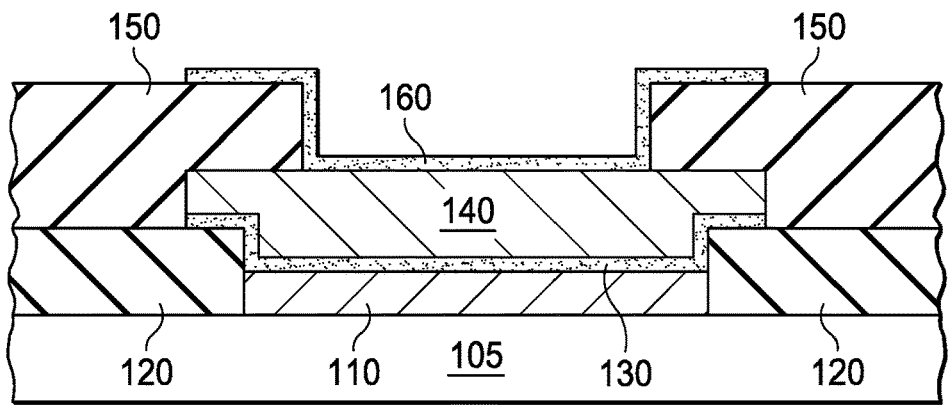

FIG. 6 illustrates the formation of a second adhesion layer 160. The second adhesion layer 160 could be formed of titanium (TI) and its alloys (for example, TiW/Au, TiW/Ni/Au, TiW/Pd/Au and TiW/Cu/Ni/Au). The illustrated example has a second adhesion layer 160 formed over the metal barrier layer 140 and sidewall portions 153 of the polyimide layer 150. The second adhesion layer 160 extends over shoulders 154 of the polyimide layer 150 on which the under bump metallurgy layer 170 (FIG. 7) will sit.

Figure 7:
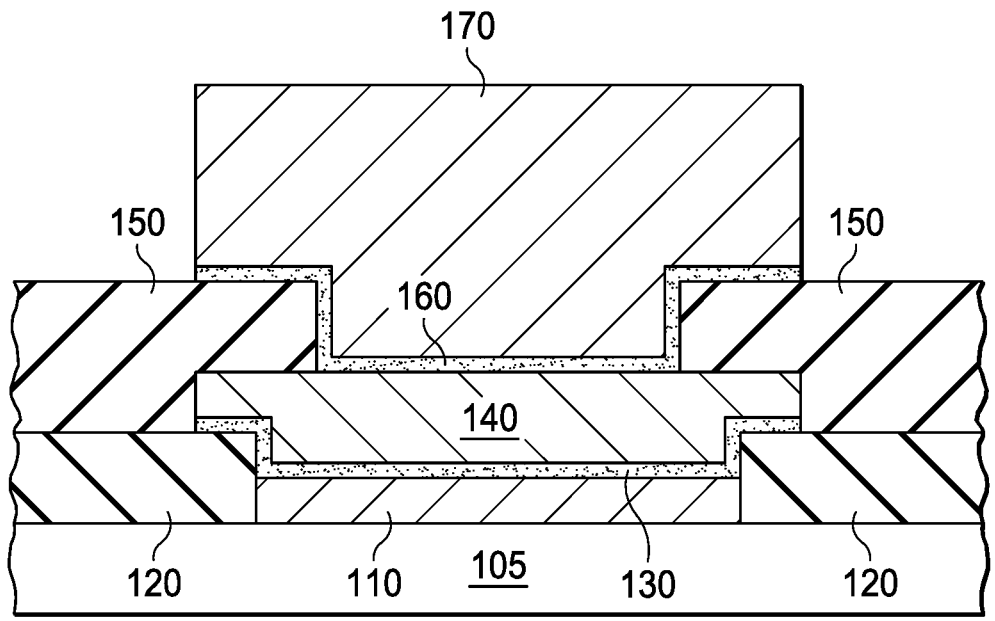

FIG. 7 illustrates the formation of the under bump metallurgy layer 170. The under bump metallurgy layer 170 can be formed of copper. As illustrated, the under bump metallurgy layer 170 is formed over a medial portion of the barrier metal layer.

Figure 8:
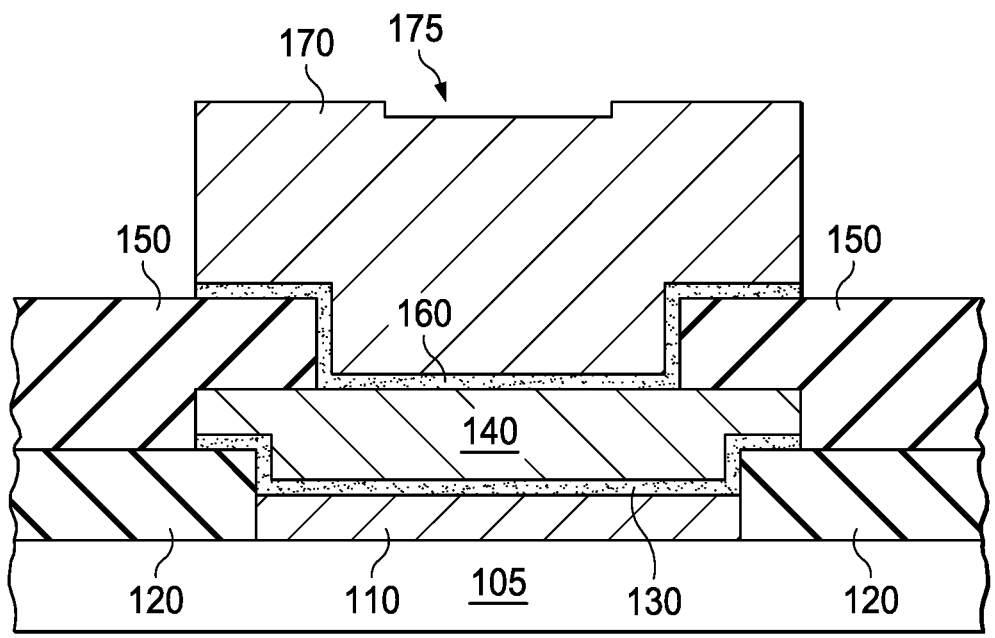
Figure 9:
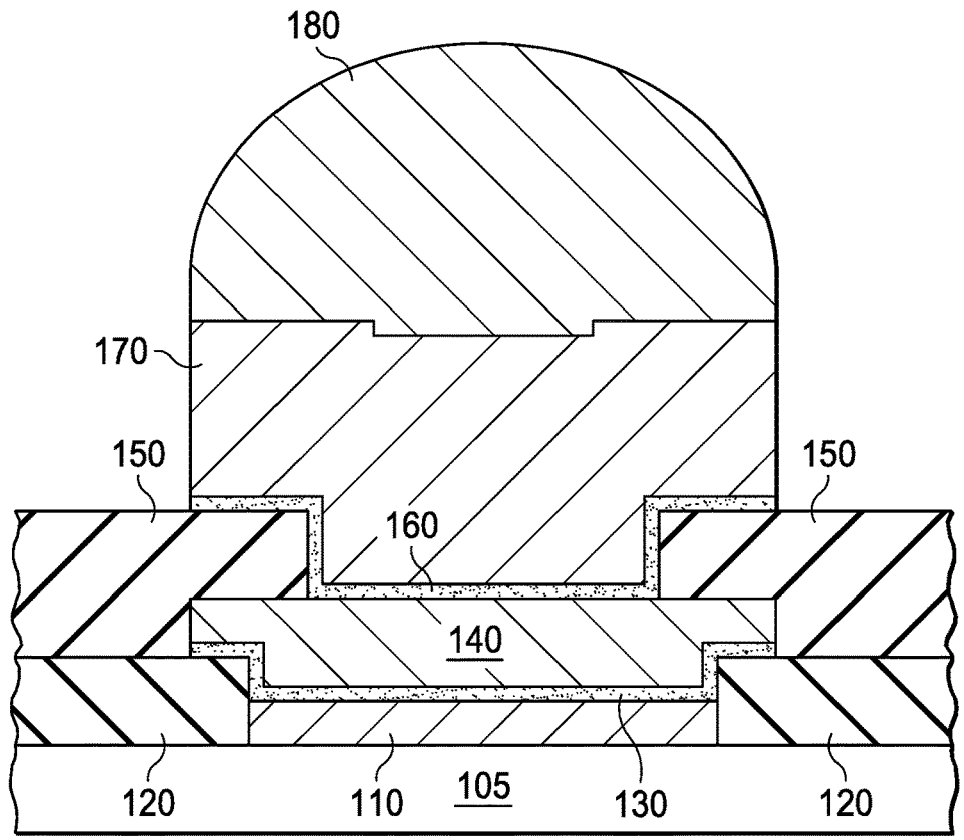

FIG. 8 illustrates a via formed within the under bump metallurgy layer 170. The via forms a trench 175 within the under bump metallurgy layer 170 with two sidewall regions. It should be noted that this example is not intended to be limiting. For example, the under bump metallurgy layer 170 can remain flat; that is, no trench is required. FIG. 9 illustrates the formation of a solder bump 180 over the under bump metallurgy layer 170. The solder bump 180 can be formed of tin-silver (referred generally as SnAG in the field).

Figure 10:
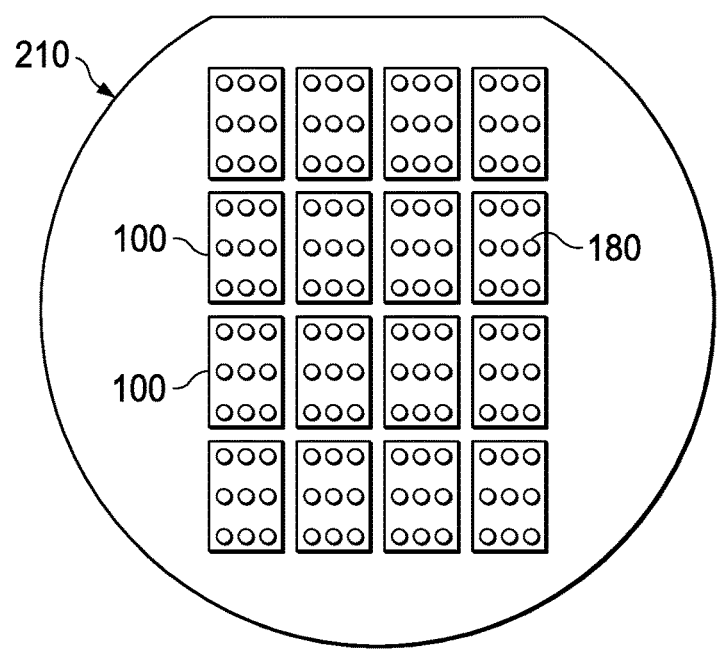
FIG. 10 illustrates an integrated circuit wafer having at least one semiconductor device having a barrier metal layer.

It should be understood that an integrated circuit can have multiple structures, at least one of which is made in accordance with the process described above with respect to FIGS. 2-9. For example, as illustrated in FIG. 10 an integrated circuit wafer 210 includes multiple semiconductor devices, at least one of which is the FIG. 1 semiconductor device 100 having solder bumps 180. Like the process described above with respect to FIGS. 2-9, a plurality of semiconductor devices 100 could be formed on a single integrated circuit wafer 210. That process includes providing a plurality of integrated circuits 105 (FIG. 1) on an integrated circuit wafer 210. The integrated circuit wafers could be 200 mm in diameter or 300 mm in diameter. Other dimensions could also be used. The process further includes forming a metallization layer 110 (FIG. 1) over each of the integrated circuits, and forming a barrier metal layer 140 (FIG. 1) over each metallization layer. The process further includes forming a polyimide layer 150 (FIG. 1) over lateral portions of each barrier metal layer 145 (FIG. 5B). The polyimide layer 150 is formed in the manner described above with respect to FIGS. 5A-5D. As discussed above with respect to FIG. 5C, the barrier metal layer 140 acts to limit or prevent TMAH from contacting the metallization layer 110. The process can take place in a semiconductor manufacturing facility.

Figure 11:
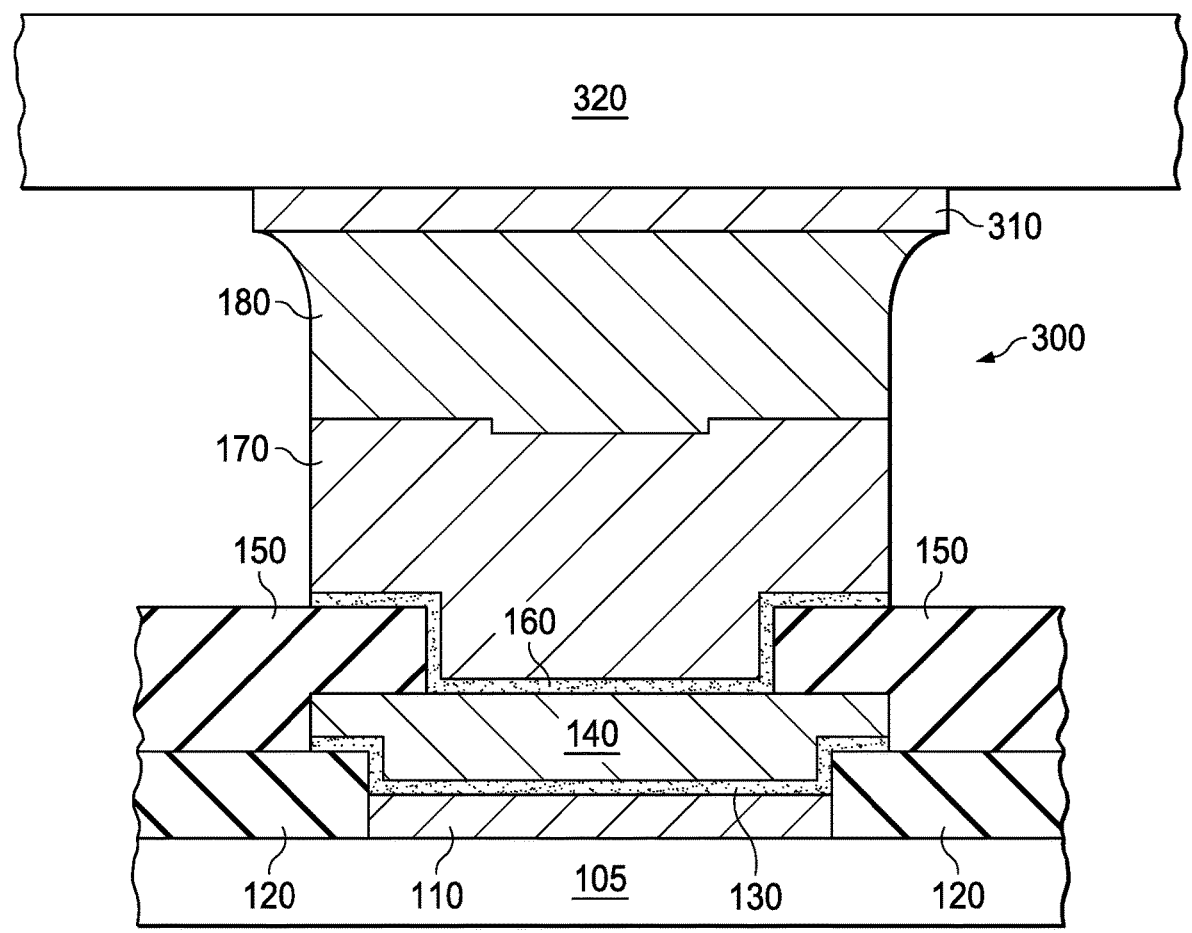
FIG. 11 illustrates a partial cross-sectional view of semiconductor package having a barrier metal layer.

Each semiconductor device 100 can be singulated or cut from the wafer. Each of the semiconductor devices 100 can be further processed to form a semiconductor package, such as, for example, a flip chip small outline transistor. FIG. 11 illustrates a partial cross-sectional view of a portion of semiconductor package 300 having the barrier metal layer 140 (FIG. 1) discussed above. As illustrated, the semiconductor package 300 includes an integrated circuit 105 with functional circuitry having a bond pad 310 formed over the solder bump 180. The solder bump 180 is heated to reflow such that it couple with the above-located bond pad 310. The bond pad 310 can be coupled to a substrate 320 before the bond pad 310 is coupled to the solder bump 180.

Figure 12:
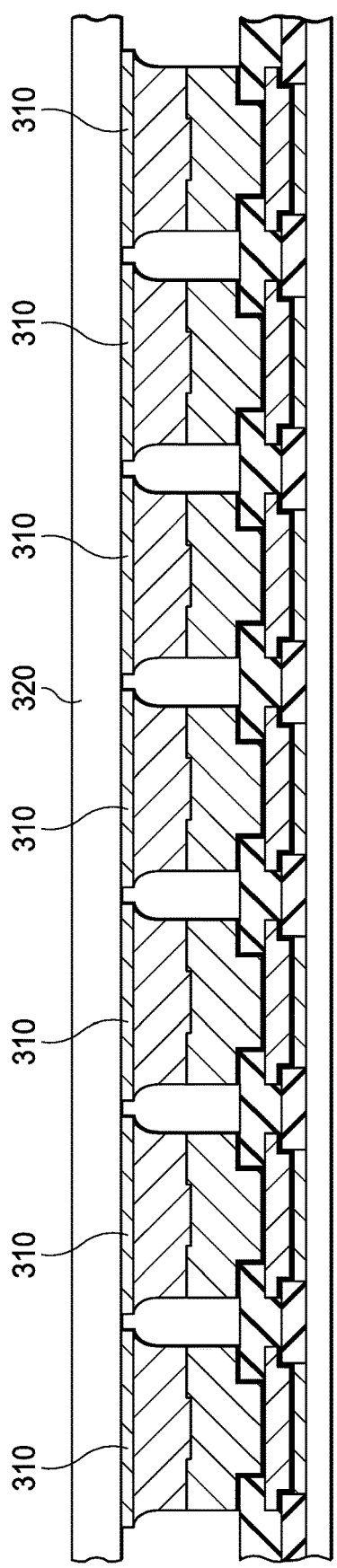
FIG. 12 illustrates a partial cross-sectional view of semiconductor package having a barrier metal layer.

FIG. 12 illustrates a cross-sectional view of a plurality of the FIG. 11 elements. A plurality of metallization layers 110 are formed over the integrated circuit 105. A plurality of passivation layers 120 are formed adjacent to the metallization layers 110. A plurality of first adhesion layers 130 are formed over the metallization layer 110 and portions of the passivation layers 120. A plurality of barrier metal layers 140 are formed over the first adhesion layers 130.

A plurality of polyimide layers 150 are formed adjacent the barrier metal layers 140 with portions of the polyimide layers 150 covering topmost surfaces of the barrier metal layer 140. A plurality of second adhesion layers 160 are formed over portions of the polyimide layers 150 and covering exposed portions of the barrier metal layers 140 between the polyimide layers 150. A plurality of under bump metallurgy layers 170 are formed over the second adhesion layers 160. A plurality of solder bump 180 are formed over the under bump metallurgy layers 170. A plurality of bond pads 310 coupled to a substrate 320 are provided over the solder bumps 180, and can be heated to reflow the solder bump and provide a mechanical and electrical coupling between the integrated circuit 105 (FIG. 11) and the substrate 320. It should be understood that substrate 320 could be a printed circuit board or a package substrate.

Figure 13:
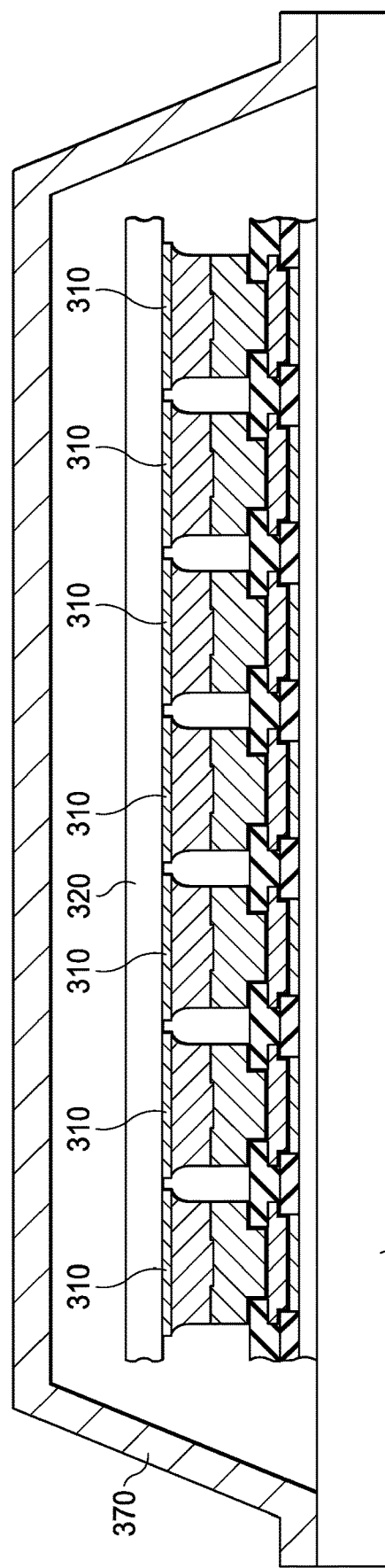
FIG. 13 illustrates a further aspect of the disclosure.

The semiconductor package 300 can be further packaged to include an outer housing having a package lid 370 and a package substrate 390, as illustrated in FIG. 13. It should be noted that the package substrate 390 is optional as substrate 320 could be serve as a package substrate. In such an alternative aspect of the disclosure in which the substrate 320 is a package substrate, the package lid 370 could be attached to the substrate 320 and be located below the integrated circuit 105. The package lid 370 may be attached to the substrate 390, for example, by adhesives, possibly electrically conductive adhesives, welding or soldering.

Figure 14:
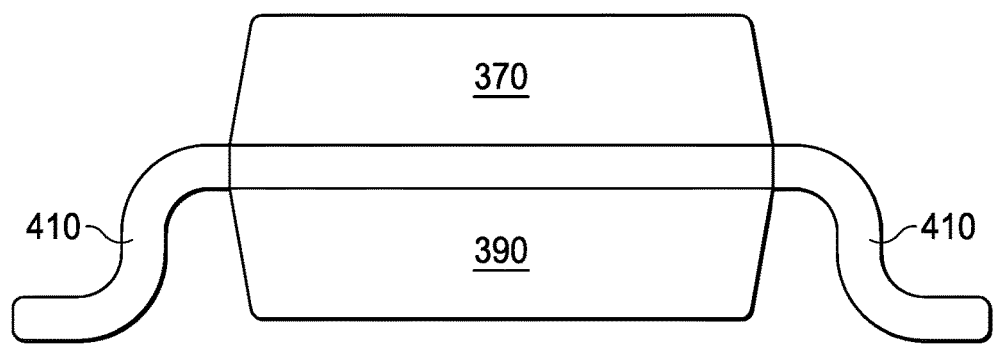
FIG. 14 illustrates a further aspect of the disclosure.

Referring now to FIG. 14, the package lid 370 and/or the substrate 390 may optionally make electrical connections to electrical leads located outside of the semiconductor package 300. For example, as illustrated in FIG. 14, lead wires 410 that are electrically coupled to the components of the semiconductor elements and extend outside the package such that they are capable of being coupled to circuitry in an electronic device (not shown).

The above discussion is meant to be illustrative of the principles and various examples of the disclosure. Numerous variations and modifications will become apparent to those skilled in the art once the above disclosure is fully appreciated. For example, while the cross-sectional thicknesses of the various layers have been illustrated relative to one another in FIGS. 1-14, they are not intended to be limiting. Different relative thicknesses can be used. It should be noted that terms such as "above", "below", and the like, are used herein only to facilitate the description of the structure of the semiconductor package illustrated. It will be evident that the packages and interconnect structures may be used in a variety of orientations, including upside down orientations, and tilted orientations.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Accordingly, it is intended that the following claims be interpreted to embrace all such variations and modifications.

What is claimed is:

1. A semiconductor device comprising:
a metallization layer electrically connected to an integrated circuit;
a passivation layer adjacent to the metallization layer;
a barrier layer of a same metal, electrically connected to the metallization layer and contacting a first adhesion layer, wherein the first adhesion layer contacts the passivation layer;
a polyimide layer in contact with the passivation layer and directly in contact with portions of a top surface of the barrier layer;
a metal structure electrically connected to the barrier layer, the metal structure in contact with a second adhesion layer, and the second adhesion layer in contact with portions of the polyimide layer; and
solder in contact with the metal structure.

2. The semiconductor device of claim 1, wherein an edge of the metal structure and an edge of the barrier layer align with each other in a cross-sectional view of the semiconductor device.

3. The semiconductor device of claim 1, wherein the barrier layer is composed of a metal selected from a group consisting of copper and nickel.

4. The semiconductor device of claim 1, wherein an edge of the first adhesion layer and an edge of the second adhesion layer align with each other in a cross-sectional view of the semiconductor device.

5. The semiconductor device of claim 3, wherein the second adhesion layer contacts portions of the polyimide layer and a portion of the top surface of the barrier layer.

6. The semiconductor device of claim 3, wherein each of the first adhesion layer and the second adhesion layer is selected from a group consisting of TiW/Au, TiW/Ni/Au, TiW/Pd/Au, and TiW/Cu/Ni/Au.

7. The semiconductor device of claim 1, wherein the metal structure is composed of a metal selected from a group consisting of copper and nickel.

8. An integrated circuit package comprising:
a metallization layer electrically connected to an integrated circuit;
a passivation layer adjacent to the metallization layer;
a barrier layer of a same metal, electrically connected to the metallization layer and contacting the passivation layer;
a polyimide layer in contact with the passivation layer and directly in contact with portions of a top surface of the barrier layer; and
a metal structure electrically connected to the barrier layer, the metal structure in contact with the polyimide layer, wherein the metal structure includes a trench filled with solder, and wherein the trench includes sidewalls that are substantially perpendicular to a bottom of the trench.

9. The semiconductor device of claim 8, wherein the barrier layer includes copper.

10. The semiconductor device of claim 8, wherein the barrier layer includes nickel.

11. The semiconductor device of claim 8, wherein the barrier layer includes a first adhesion layer in contact with the metallization layer.

12. The semiconductor device of claim 8, wherein the metal structure includes a second adhesion layer contacting the barrier layer and portions of the polyimide layer.

13. The semiconductor device of claim 8, wherein barrier layer is adapted to prevent tetramethylammonium hydroxide from contacting the metallization layer.

14. A semiconductor device comprising:
a metallization layer electrically connected to an integrated circuit;
a passivation layer adjacent to the metallization layer;
a barrier layer of a same metal, electrically connected to the metallization layer and contacting a first adhesion layer, wherein the first adhesion layer contacts the passivation layer;
a polyimide layer in contact with the passivation layer and directly in contact with portions of a top surface of the barrier layer;
a metal structure electrically connected to the barrier layer, the metal structure in contact with a second adhesion layer, and the second adhesion layer in contact with portions of the polyimide layer;
solder in contact with the metal structure; and
a substrate in contact with the solder, wherein the metallization is electrically connected to the substrate.

15. The semiconductor device of claim 14 further comprising a housing covering the semiconductor device.

16. A process for forming a semiconductor device, comprising:
- forming a metallization layer over a portion of an integrated circuit;
- forming a passivation layer adjacent to the metallization layer;
- forming a barrier layer of a same metal, contacting the metallization layer and over portions of the passivation layer via a first adhesion layer;
- forming a polyimide layer over portions of the barrier layer, wherein the polyimide layer directly contacts portions of a top surface of the barrier layer;
- treating the polyimide layer with tetramethylammonium hydroxide such that the tetramethylammonium hydroxide does not contact the metallization layer; and
- forming a metal structure over the polyimide layer and portions of the barrier layer; and
- depositing solder over the metal structure.

17. The method of claim 16 further comprising forming the first adhesion layer between the metallization layer and the barrier layer, prior to forming the barrier layer.

18. The method of claim 16 further comprising forming a trench in the metal structure prior to depositing solder, wherein the trench includes sidewalls that are substantially perpendicular to a bottom of the trench.

19. The method of claim 16, wherein forming the polyimide layer comprises:
- forming a polyimide layer precursor over the barrier layer and integrated circuit;
- selectively curing portions of the polyimide layer precursor; and
- treating the cured portions of the polyimide layer with tetramethylammonium hydroxide such that the tetramethylammonium hydroxide does not contact the metallization layer due to the barrier layer.

* * * * *